(12) United States Patent
Schindler et al.

(10) Patent No.: US 9,829,346 B2
(45) Date of Patent: Nov. 28, 2017

(54) OPERATING DEVICE FOR MOTOR VEHICLES

(71) Applicant: HUF HÜLSBECK & FÜRST GMBH & CO. KG, Velbert (DE)

(72) Inventors: Mirko Schindler, Velbert (DE); Peter Van Gastel, Solingen (DE); Bernd Gerdes, Essen (DE)

(73) Assignee: Huf Huelsbeck & Fuerst GmbH & Co. KG, Velbert (DE)

( * ) Notice: Subject to any disclaimer, the term of this patent is extended or adjusted under 35 U.S.C. 154(b) by 11 days.

(21) Appl. No.: 14/916,912

(22) PCT Filed: Aug. 5, 2014

(86) PCT No.: PCT/EP2014/066846
§ 371 (c)(1),
(2) Date: Mar. 4, 2016

(87) PCT Pub. No.: WO2015/036180
PCT Pub. Date: Mar. 19, 2015

(65) Prior Publication Data
US 2016/0216135 A1    Jul. 28, 2016

(30) Foreign Application Priority Data
Sep. 12, 2013  (DE) .................. 10 2013 110 010

(51) Int. Cl.
*G01D 5/24*      (2006.01)
*H03K 17/96*     (2006.01)
*E05F 15/76*     (2015.01)

(52) U.S. Cl.
CPC .............. *G01D 5/24* (2013.01); *E05F 15/76* (2015.01); *H03K 17/9622* (2013.01);
(Continued)

(58) Field of Classification Search
CPC combination set(s) only.
See application file for complete search history.

(56) References Cited

U.S. PATENT DOCUMENTS

| 5,730,165 A | 3/1998 | Philipp |
| 2005/0264304 A1 | 12/2005 | Nakamura et al. |

(Continued)

FOREIGN PATENT DOCUMENTS

| EP | 1 339 025 A1 | 8/2003 |
| EP | 2 067 665 A1 | 6/2009 |

(Continued)

OTHER PUBLICATIONS

International Preliminary Report on Patentability, along with English translation thereof, of International Application No. PCT/EP2014/066846 dated Sep. 26, 2014, 13 pages.

(Continued)

*Primary Examiner* — Clayton E Laballe
*Assistant Examiner* — Jas Sanghera
(74) *Attorney, Agent, or Firm* — Fay Sharpe LLP

(57) ABSTRACT

An operating device for a motor vehicle includes a plurality of proximity sensors for detecting contactless actuation. The operating device extends in a first plane and the sensors are disposed in that plane, separated from one another and oriented with their detection regions in the same spatial direction. A control and evaluation device is coupled to the sensors for detection of signals from each of the sensors. The sensors are covered with at least one electrically insulating plastic cover and, thus, separated from the detection region. At least one electrically conductive separating device is disposed between the sensors and oriented toward the side facing the detection regions, and directly adjacent to the plastic cover.

17 Claims, 1 Drawing Sheet

(52) U.S. Cl.
CPC .................. *E05Y 2900/532* (2013.01); *H03K 2217/96079* (2013.01); *H03K 2217/960755* (2013.01); *H03K 2217/960765* (2013.01)

(56) References Cited

U.S. PATENT DOCUMENTS

| | | | |
|---|---|---|---|
| 2007/0041169 A1* | 2/2007 | Konet | H03K 17/962 362/84 |
| 2008/0136792 A1 | 6/2008 | Peng et al. | |
| 2008/0257706 A1* | 10/2008 | Haag | B29C 45/14655 200/600 |
| 2009/0321149 A1 | 12/2009 | Kaltner | |

FOREIGN PATENT DOCUMENTS

| WO | WO 2008/131305 A1 | 10/2008 |
|---|---|---|
| WO | WO 2013/117386 A1 | 8/2013 |

OTHER PUBLICATIONS

International Search Report of International Application No. PCT/EP2014/066846 dated Sep. 26, 2014, 4 pages.

* cited by examiner

OPERATING DEVICE FOR MOTOR VEHICLES

BACKGROUND

The invention relates to an operating device for motor vehicles. In particular, the invention relates to an operating device for detecting the proximity of users of motor vehicles, wherein the operating device has numerous proximity sensors.

Various detection devices for user access of motor vehicles are known. In particular, optical and capacitive sensor devices are known that detect the proximity of a user or the body part of a user.

By way of example, WO2013/117386 describes a device and a detection method having numerous sensor electrodes with which the accessing of a vehicle hatch is detected. The sensor assembly disclosed therein is designed for detecting movement gestures on a motor vehicle, wherein two sensor electrode assemblies are disposed at spatially offset positions on the motor vehicle. The sensor electrodes are designed as elongated electrode assemblies, and a control and evaluation device registers the changes in the capacitance detected by the sensor electrode assembly. The control and evaluation device is designed for detecting a temporal series of capacitance values for each of the sensor electrode assemblies. Points in time for the activation and the deactivation of each sensor assembly are detected and, when checked for actuation detection by the control and evaluation device, the time difference between the points in time for the activations of the sensor electrode assemblies (activation time difference) and the time difference between the points in time for the deactivation of the sensor electrodes (deactivation time difference) are compared.

Capacitive sensor assemblies of this type can be deployed at different locations on motor vehicles. Normally, control and evaluation circuits are coupled to sensor electrodes, which circuits detect a change in the capacitance of sensor electrodes.

By way of example, the associated capacitive sensor electrodes are periodically coupled to an operating voltage at a given frequency, and a parameter that is a function of the capacitance is monitored. Methods and devices of this type are known from U.S. Pat. No. 5,730,165.

A capacitive sensor with another evaluation method is disclosed in EP 1339025B1.

The design of the sensor electrodes for capacitive sensors may be obtained in a number of ways thereby, e.g. as elongated electrodes, which are disposed in the rear bumper region in order to detect a foot-actuation of the rear hatch (kick-sensor).

On the other hand, other types of proximity sensors, aside from the capacitive proximity sensors, are also known, e.g. such sensors that detect a change in the magnetic field in the surroundings of the sensor.

The arrangement and positioning of such sensor assemblies on a vehicle is problematic because the sensors should be easy to operate and access, without jeopardizing the structural integrity of the vehicle or the aesthetic appearance.

The object of the invention is to create a compact and reliable, multifunctional operating device, which can be installed on a motor vehicle body, or integrated therein.

BRIEF SUMMARY

This object is achieved in accordance with the invention by an operating device having the features of claim 1.

The operating device according to the invention has a plurality of proximity sensors for detecting a contactless actuation. These proximity sensors can be capacitive sensors, by way of example, but they can also be sensors for the detection of changes in a magnetic field.

The operating device is substantially formed with a planar or slightly bowed actuation plane, in which the sensors are spaced apart from one another, thus disposed adjacent to one another. The detection regions of the sensors are oriented in the same spatial directions. The device can thus be installed or integrated on an exterior surface of the vehicle with a substantially planar design.

A control and evaluation circuit is coupled to the sensors, for registering and evaluating the signals of each individual sensor in a time-resolved manner. Thus, a plurality of proximity sensors are coupled via a control and evaluation device, such that the signals of the proximity sensors are each registered in a temporal sequence, and supplied to an evaluation circuit. Only then, when a predefined sequence or series of proximity signals have been supplied by the sensors, a successful actuation is detected. The proximity must be executed along the actuation plane thereby, by a wiping movement with the hand, for example, wherein the hand approaches the individual sensor devices successively, and then distances itself therefrom, while it moves over the detection plane.

In accordance with the invention, all of the proximity sensors are provided with an electrically insulating plastic cover in relation to the detection region. The plastic covers can be penetrated by electrical and magnetic fields. The detection by the proximity sensors occurs through these plastic covers, which separate the actual sensors from the detection region. The actual sensors are accordingly protected from the environment, and cannot be accessed directly. Accordingly, environmental effects such as moisture or dirt are kept away from the sensors.

In accordance with the invention, at least one electrically conductive separating device is disposed, in each case, between the sensors, seen in a direction parallel to the detection plane, on the side facing the detection region (thus on the exterior, when installed on a vehicle). Electrically conductive separating devices thus separate the sensor regions and their detection regions from one another on the exterior surface. Any conductive structure that can extend between the sensor electrodes, bordering on the plastic covers, may be regarded as a separating device. Thus, it can be an electrically conductive framework or grid structure, or it can be a single conductor structure. The separating device can be composed of a metallic structure or a conductive coating on the plastic covers, or it can also be designed with metallic wires or chrome plated plastic tracks, or chrome plated plastic bodies between the detection regions.

The formation of such an electrically conductive separating device on the exterior surface improves the separate detectability of the individual sensor actuations and the temporal sequence of the proximities. Depending on the type of sensor, the sensitivity of the capacitive sensors, or the magnetic field sensors, is spatially delimited, such that an overlapping of the sensitive region of one sensor on that of an adjacent sensor is reduced. By way of example, sensors spaced at a few centimeters apart can be disposed in a plane, and a plastic chrome plated barrier is disposed between the detection regions. The metal-plated barrier acts as a shield for the electrical field of a capacitive sensor, such that the sensitivity is concentrated on the region above the sensor, thus the region of the plastic cover of the sensor. The barrier also counteracts an overlapping for the sensor regions for static and low-frequency magnetic fields.

If an actuation is then desired, a hand wipes over the detection region of the first sensor at a short distance thereto (but without any contact), for example, then over the conductive separating device, and subsequently the detection region of the second sensor. The sensors then deliver temporally cleanly separated signals to the evaluation circuit, because of the separating device. The important thing is that the electrically conductive separating device is disposed as a separation between the active sensor regions, and is oriented such that it faces outward, toward the detection region.

In a further development of the invention, three or more proximity sensors are provided, the detection regions of which are each entirely separated from one another by separating devices disposed between each of them. A plurality of sensors of this type offers the possibility of monitoring more complex movement patterns for an actuation by a user.

In a preferred design, the plastic cover for the sensors is designed such that it is continuous in the detection plane. The plastic cover thus covers all of the sensor devices. The electrically conductive separating device faces toward the detection, and is attached to this continuous plastic cover, e.g. it is glued thereto, or attached thereto with other attachment means. The electrically conductive detection device thus does not need to separate the plastic covers of the individual sensor devices from one another; it is sufficient when it is placed on the exterior of the plastic cover, and separates the detection regions there.

In another design of the invention, the plastic covers of the individual sensors are formed separately, and placed between the conductive separating devices. In this manner, it is possible to obtain a flatter structural design of the sensor device.

In a further development of the invention, a light source, or waveguide coupled to a light source, is disposed beneath the separating device. An illumination of the electrically conductive separating device of this type makes it possible to reliably locate the actuation regions, and detect the separations thereof, even in the dark. By way of example, EP 2067665 discloses a possibility for illuminating such an electrically conductive separating device, wherein the separating device is designed as a manufacturer logo.

As explained above, the proximity sensors can be designed as capacitive as well as magnetic field sensors. On one hand, capacitive sensors may be used if a robust and reliable, flexible evaluation is desired. Capacitive sensors sometimes have the problem, however, that changing environmental conditions, e.g. rain, dew, or snow, lead to a clear reduction in the detection capacity. Magnetic field sensors, in turn, may react sensitively, and less dependently on such environmental effects, but a separation of the detection regions and delimitation of the detection regions may be more problematic.

Both sensor designs thus exhibit certain advantages, depending on the field of application, and both can be advantageously combined with the design of the detection device according to the invention.

In a preferred design of the invention, the signal retrieval from the separated sensor regions occurs such that the actuation patterns are stored in the control and evaluation device. The adjacent sensor regions may be actuated in a temporal sequence, in the manner of a wiping motion, up and down motion, circular motion or suchlike, and this temporal sequence is evaluated. Only when the stored actuation sequence is identical to an actuation pattern does the control and evaluation device supply a corresponding signal to a central control device in the motor vehicle. In this manner, different functions can also be initiated on one and the same operating device. A movement in one direction may trigger a different function than a movement in the opposite direction.

The important thing about the invention is that a technical improvement regarding the separation of the detection regions is obtained, while at the same time, an improved design possibility for the operating device is also made available. Both the plastic cover as well as the electrically conductive separating device may have an aesthetic design, wherein, for example, a vehicle logo or manufacturer logo may be formed by the metallic separating part. In this manner, the operating device can be integrated in the vehicle logo, and the plastic cover region, thus the regions between the metallic separating devices, are the active sensor surfaces. This device then fulfills a design purpose, as well as resulting in an improved and easily locatable operating device for the vehicle user. If such a vehicle logo is then also illuminated according to the invention, then the actuation region can be easily found in any situation. Because the operating device is no longer installed at concealed locations, but instead, can be placed at prominent locations on the vehicle, the operability is improved. Vehicle logos are frequently disposed at precisely those positions at which an actuation would be desirable, but which otherwise prevent the attachment of a sensor device. The integration of the sensor device in the logo itself enables a double functionality, and simplifies the operation thereof.

BRIEF SUMMARY OF THE DRAWINGS

The invention shall now be explained in greater detail based on an exemplary embodiment.

DETAILED DESCRIPTION

Figure 1:
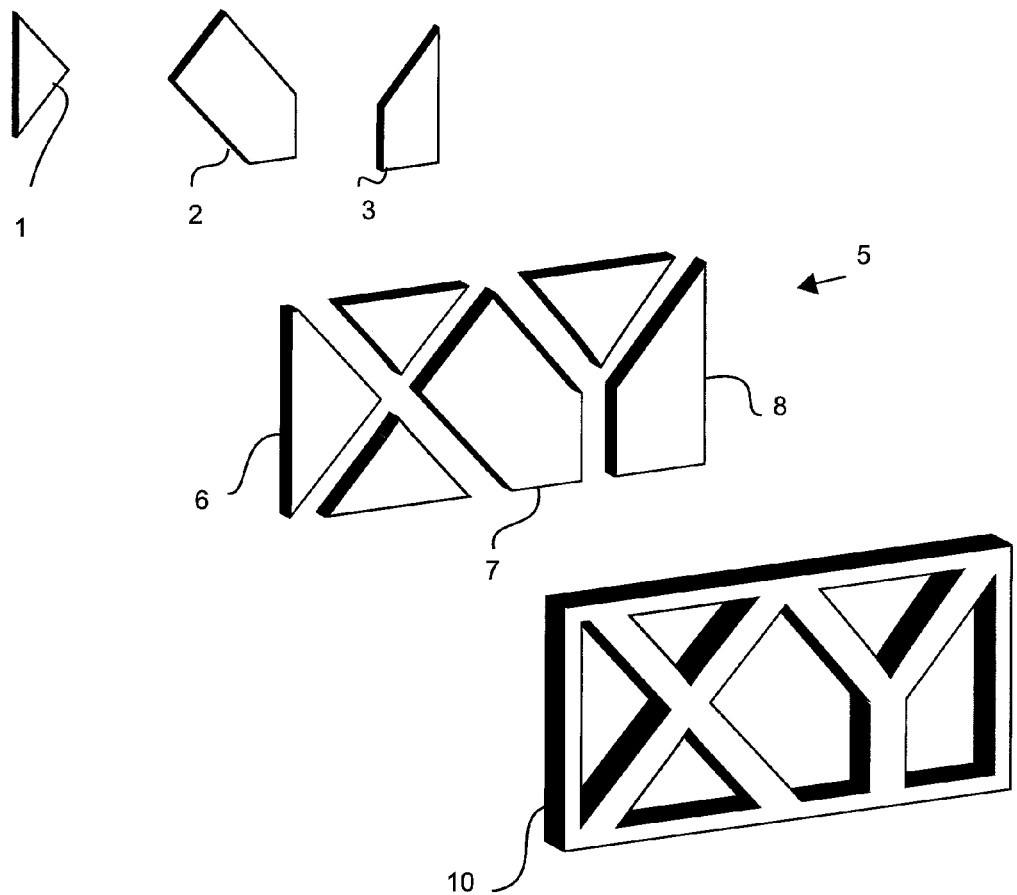
FIG. 1 shows, schematically, the structure of an operating device according to the invention, comprising capacitive sensor electrodes, plastic covers and metallic separating devices.

Three differently shaped sensor electrode sections 1, 2, 3 are depicted in FIG. 1. These sensor electrodes are formed from a metallic plate. Numerous electrically insulating plastic covers 5 are shown. It can be seen that the sensor electrodes 1, 2, 3 are adapted to the shape of the plastic covers 6, 7 and 8, respectively. The sensors electrodes 1, 2, 3 are smaller thereby, such that edge areas remain exposed in each case, when the sensor electrodes are disposed beneath the plastic covers. The plastic covers thus overlap the sensor electrodes at all sides. A metallic separating device 10 is adapted in terms of its shape to the plastic parts 5, such that the plastic parts act as inserts in the empty spaces in the metallic cover 10. When the electrodes 1, 2, 3 are placed behind the respective plastic covers 6, 7 and 8, they are then separated on all sides from the metallic separating device 10. The metallic separating device 10 is designed as an emblem for a vehicle manufacturer, and may be disposed in the rear region of a vehicle, or in the front region thereof.

Figure 2:
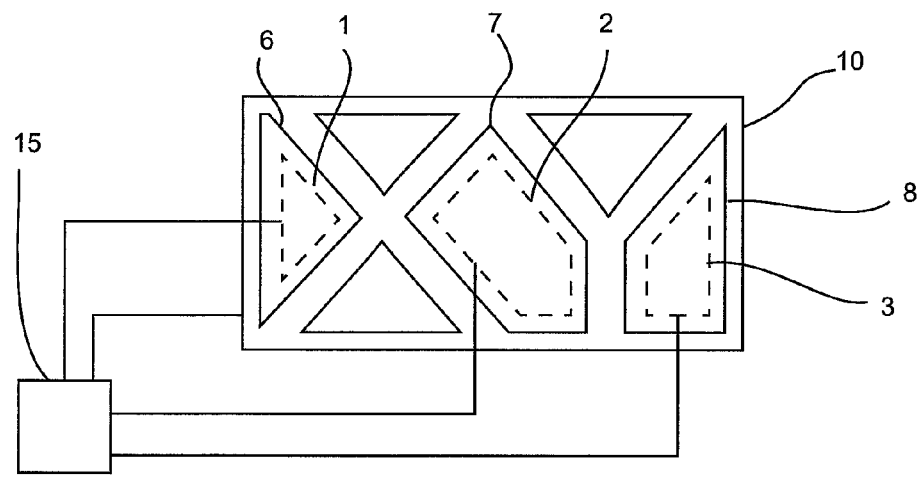
FIG. 2 shows, schematically, the coupling of the operating device according to the invention to a control and evaluation device.

FIG. 2 shows the arrangement of the components in relation to one another, in a fully installed embodiment according to the invention.

In this front view, it is shown that the electrodes 1, 2, 3 are disposed in the respective separated sensor regions, wherein they are each covered by the plastic covers 6, 7 and 8. Each of the sensor electrodes 1, 2, 3 is coupled to a control and evaluation device 15, which detects the capacitance values of each of the sensor electrodes in a time-resolved manner.

If the hand of a user is then guided over the detection device, e.g. from left to right, a series of capacitance changes, first in the sensor electrode 1, subsequently in the sensor electrode 2, and lastly in the sensor electrode 3, is detected. The separation of the detection regions by the electrically conductive separating device 10 results in a clear separation of the sensor signals.

It is also illustrated in this example that the metallic separating device 10 is likewise coupled to the control and evaluation circuit, but it may also be coupled to the vehicle ground. A coupling with the control and evaluation circuit furthermore enables a shield voltage to be applied to the separating device 10, in order to obtain an even better delimitation of the sensor regions.

The accommodation of the proximity sensors in an electrically conductive separating device designed in this manner creates an operating device that can be placed aesthetically and prominently on a vehicle, which can also detect a complex actuation behavior of the user.

The invention claimed is:

1. An operating device for a motor vehicle, including a plurality of proximity sensors for detecting contactless actuation, wherein the operating device extends in a first plane, and the proximity sensors are disposed in the first plane, separated from one another, and oriented with their detection regions in the same spatial direction, wherein a control and evaluation device is coupled to the proximity sensors, which is designed for a temporal detection of signals from each of the plurality of proximity sensors, wherein the plurality of proximity sensors are covered with at least one electrically insulating plastic cover, and thus separated from the detection region, wherein at least one electrically conductive separating device is disposed between the plurality of proximity sensors, oriented toward the side facing the detection regions, and directly adjacent to the at least one plastic cover, wherein the at least one plastic cover is made of multiple parts, and the at least one electrically conductive separating device extends between the parts of the at least one plastic cover, wherein a shape of the at least one separating device is adapted to cooperate with the at least one plastic cover such that the plastic parts act as inserts located in voids defined in the at least one electrically conductive separating device; and
wherein the at least one electrically conductive separating device comprises an emblem of a vehicle manufacturer.

2. The operating device according to claim 1, wherein at least three proximity sensors are provided, between which, in each case, sections of the at least one electrically conductive separating device are disposed.

3. The operating device according to claim 1, wherein at least one light source, or a wave guide coupled to a light source, is disposed beneath the at least one electrically conductive separating device, thus on the side of the at least one electrically conductive separating device facing toward the detection region.

4. The operating device according to claim 1, wherein at least one of the proximity sensors is designed as a capacitive sensor.

5. The operating device according to claim 1, wherein at least one of the plurality of proximity sensors is designed as a magnetic field sensor.

6. The operating device according to claim 1, wherein the control and evaluation device is designed to generate an actuation signal, as a function of a series of proximity detections from at least two of the plurality of proximity sensors.

7. The operating device according to claim 1, wherein the at least one electrically conductive separating device is coupled to the control and evaluation device for applying a given potential thereto.

8. The operating device according to claim 7 wherein the potential is a ground potential.

9. A planar operating device for a motor vehicle, comprising:
at least two spaced proximity sensors for detecting a contactless actuation, wherein the at least two proximity sensors are oriented with their detection regions facing in the same spatial direction;
a control and evaluation device electrically coupled to the at least two proximity sensors;
at least two spaced electrically insulating plastic covers, wherein a respective one of the at least two plastic covers overlies a respective one of the at least two proximity sensors; and
an electrically conductive separating device including at least two spaced voids, each accommodating respective ones of the at least two plastic covers and of the at least two proximity sensors.

10. The operating device of claim 9 wherein each of the at least two plastic covers overlaps a respective one of the at least two proximity sensors that the respective plastic cover overlies on all sides of the respective proximity sensor in order to electrically separate the respective proximity sensor from the electrically conductive separating device.

11. The operating device of claim 9 further comprising a light source, or a wave guide coupled to a light source, which is disposed beneath the separating device and faces towards the detection regions of the at least two spaced proximity sensors.

12. The operating device of claim 9 wherein the at least two proximity sensors comprise at least one of capacitive sensors and magnetic field sensors.

13. The operating device of claim 9 wherein the control and evaluation device generates an actuation signal as a function of a series of proximity detections from the at least two proximity sensors.

14. The operating device of claim 9 wherein the control and evaluation device is also electrically coupled to the electrically conductive separating device.

15. The operating device of claim 14 wherein the separating device is coupled to the control and evaluation device for applying a given potential thereto.

16. The operating device of claim 15 wherein the potential is a ground potential.

17. The operating device of claim 9 wherein the separating device comprises an emblem of a vehicle manufacturer.

* * * * *